(12) United States Patent
Hayase et al.

(10) Patent No.: US 9,064,620 B2
(45) Date of Patent: Jun. 23, 2015

(54) SUPERCONDUCTING THIN FILM AND METHOD OF MANUFACTURING SUPERCONDUCTING THIN FILM

(75) Inventors: Yuko Hayase, Tokyo (JP); Yoshikazu Okuno, Tokyo (JP); Hiroyuki Fukushima, Tokyo (JP); Eiji Kojima, Tokyo (JP); Hisaki Sakamoto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 20 days.

(21) Appl. No.: 13/814,160

(22) PCT Filed: Jul. 11, 2012

(86) PCT No.: PCT/JP2012/067707
§ 371 (c)(1),
(2), (4) Date: Feb. 4, 2013

(87) PCT Pub. No.: WO2013/008851
PCT Pub. Date: Jan. 17, 2013

(65) Prior Publication Data
US 2013/0130916 A1 May 23, 2013

(30) Foreign Application Priority Data
Jul. 11, 2011 (JP) .................................. 2011-152866

(51) Int. Cl.
*H01L 39/24* (2006.01)
*H01B 12/02* (2006.01)

(52) U.S. Cl.
CPC ......... *H01B 12/02* (2013.01); *Y10T 428/12458* (2015.01); *Y10T 428/12549* (2015.01); *H01L 39/2454* (2013.01); *H01L 39/2461* (2013.01)

(58) Field of Classification Search
CPC ................................................... H01L 39/2454
USPC ......................................... 505/237, 238, 239
See application file for complete search history.

(56) References Cited

U.S. PATENT DOCUMENTS

2005/0174025 A1* 8/2005 Okamoto ....................... 313/143
2011/0218113 A1* 9/2011 Miyata et al. .................. 505/230

FOREIGN PATENT DOCUMENTS

| JP | 64 60913 | 3/1989 |
| JP | 64 81116 | 3/1989 |
| JP | 3 39458 | 2/1991 |

(Continued)

OTHER PUBLICATIONS

Machine translation of JP 2011-249026 (2011).*

(Continued)

*Primary Examiner* — Paul Wartalowicz
(74) *Attorney, Agent, or Firm* — Oblon, McClelland, Maier & Neustadt, L.L.P.

(57) ABSTRACT

Adhesiveness between a metallic substrate and a metal oxide layer is made to increase. A superconducting thin film (1) includes a metallic substrate (10), a metallic layer (22) that is formed on a main surface of the metallic substrate (10) and includes a metal element capable of being passivated as a main component, a metal oxide layer (24) that is formed on the metallic layer (22) and includes the passivated metal element as a main component, and a superconducting layer (40) that is formed on the metal oxide layer (24) directly or through an intermediate layer and includes an oxide superconductor as a main component.

16 Claims, 4 Drawing Sheets

(56) References Cited

FOREIGN PATENT DOCUMENTS

| | | |
|---|---|---|
| JP | 2010 123475 | 6/2010 |
| JP | 2010 153090 | 7/2010 |
| JP | 2011 249026 | 12/2011 |
| WO | 2010 058823 | 5/2010 |
| WO | 2011 027886 | 3/2011 |

OTHER PUBLICATIONS

U.S. Appl. No. 13/814,085, filed Feb. 4, 2013, Okuno, et al.
U.S. Appl. No. 13/814,580, filed Feb. 6, 2013, Hayase, et al.
U.S. Appl. No. 13/813,748, filed Feb. 1, 2013, Okuno, et al.
International Search Report Issued Oct. 2, 2012 in PCT/JP12/67707 Filed Jul. 11, 2012.

* cited by examiner

SUPERCONDUCTING THIN FILM AND METHOD OF MANUFACTURING SUPERCONDUCTING THIN FILM

CROSS REFERENCE TO RELATED APPLICATIONS

The present application is a 35 U.S.C. §371 national stage patent application of International patent application PCT/JP2012/067707, filed on Jul. 11, 2012, published as WO/2013/008851 on Jan. 17, 2013, the text of which is incorporated by reference, and claims the benefit of the filing date of Japanese application no. 2011-152866, filed on Jul. 11, 2011, the text of which is also incorporated by reference.

TECHNICAL FIELD

The present invention relates to a superconducting thin film and a method for manufacturing the superconducting thin film.

BACKGROUND ART

Attempts at manufacturing superconducting thin films by forming a superconducting layer including an oxide superconductor as a main component on a metallic substrate have been frequently suggested. Among these, a superconducting wire, which is obtained by forming an oxide superconductor expressed by a compositional formula of $REBa_2Cu_3O_{7-d}$ (the oxide superconductor is called an RE-based superconductor, d represents a non-stoichiometric amount of oxygen, and RE represents a rare-earth element) on a tape-shaped metallic substrate, may obtain high current characteristics. Therefore, currently, the superconducting wire is one of superconducting films for which research and development is being actively conducted. In addition, a stage has been reached at which a number of trial products related to electric power equipment or the like using the superconducting wire are being manufactured.

Accordingly, in technology for manufacturing a superconducting thin film starting with the superconducting wire, it is preferable to establish a mass production system for industrialization as a manufacturing process, and development of a stable process with high reliability has become a matter of considerable urgency.

However, in a stage of manufacturing the superconducting thin film, metal elements making up the metallic substrate diffuse, and thus, at an interface between the metallic substrate and an upper layer (an intermediate layer or a superconducting layer) above the metallic substrate, the metal elements partially undergo an oxidation reaction, or the metal elements partially undergo an interfacial reaction with a constituent material of the upper layer. As a result, peeling-off of a formed layer may occur.

Therefore, Patent Document 1 (Japanese Patent Application Laid-Open (JP-A) No. 2010-123475) discloses a method for manufacturing a superconducting thin film. In the method, a metal oxide layer including chromium oxide as a main component is formed immediately over a metallic substrate including an Ni-based alloy, and then a superconducting layer is formed on the metal oxide layer in order to suppress diffusion of metal elements of the metallic substrate and to suppress a reaction of the metal elements, which leads to peeling-off.

DISCLOSURE OF INVENTION

Technical Problem

However, in a method like that of Patent Document 1, adhesiveness between the metallic substrate and the metal oxide layer deteriorates after manufacturing the superconductive thin film, and thus, peeling-off between the metallic substrate and the metal oxide layer may occur.

The invention has been made in consideration of the above-described circumstances, and an object thereof is to provide a superconducting thin film in which diffusion of metal elements making up a metallic substrate may be suppressed and adhesiveness between a metallic substrate and a metal oxide layer is high, and a method for manufacturing the superconducting thin film.

Solution to Problem

The above-described object of the invention is solved by the following ways.

<1> A superconducting thin film including a metallic substrate, a metallic layer that is formed on a main surface of the metallic substrate and includes a metal element capable of being passivated as a main component, a metal oxide layer that is formed on the metallic layer and includes the passivated metal element as a main component, and a superconducting layer that is formed on the metal oxide layer directly or through an intermediate layer and includes an oxide superconductor as a main component.

<2> The superconducting thin film according to <1>, in which a compositional formula of the metal oxide layer is expressed by $A_iO_j$ ($1<(j/i)\leq3$), and the metal element, A, is at least one selected from Al, Cr, or a rare-earth element.

<3> The superconducting thin film according to <1> or <2>, in which an oxide of the metal element and the metal element co-exist between the metallic layer and the metal oxide layer, and the superconducting thin film further includes a composition gradient layer in which a ratio of the oxide of the metal element with respect to the metal element continuously increases in a lamination direction from the metallic layer to the metal oxide layer.

<4> The superconducting thin film according to any one of <1> to <3>, in which a thickness of the metal oxide layer is 10 nm or more.

<5> The superconducting thin film according to any one of <1> to <4>, in which a thickness of the metal oxide layer is 300 nm or less.

<6> The superconducting thin film according to any one of <1> to <5>, in which at least the main surface of the metallic substrate is formed from a Ni-based alloy or an Fe-based alloy.

<7> A method for manufacturing a superconducting thin film, the method sequentially including a process of forming a metallic layer including a metal element capable of being passivated as a main component on a main surface of a metallic substrate, a process of forming a passivated metal oxide layer on a surface of the metallic layer by causing the metal element to be oxidized in such a manner that a part of the metallic layer remains, and a process of forming a superconducting layer including an oxide superconductor as a main component on the surface of the metal oxide layer directly or through an intermediate layer in such a manner that a part of the metallic layer remains.

<8> The method for manufacturing a superconducting thin film according to <7>, wherein, in the process of forming the metal oxide layer, the metal oxide layer is formed by heat-treating the metallic layer under an oxygen-containing atmosphere.

<9> The method for manufacturing a superconducting thin film according to <7> or <8>, w in the process of forming the metallic layer and the process of forming the metal oxide layer, a composition gradient layer is formed between the metallic layer and the metal oxide layer in such a manner that a ratio of the oxide of the metal element with respect to the metal element continuously increases in a lamination direction from the metallic layer to the metal oxide layer.

Advantageous Effects of Invention

According to the invention, it is possible to provide a superconducting thin film in which diffusion of metal elements making up a metallic substrate may be suppressed and adhesiveness between a metallic substrate and a metal oxide layer is high, and a method for manufacturing the superconducting thin film.

BRIEF DESCRIPTION OF DRAWINGS

Each of FIGS. 3(A), 3(B) and 3(C) is a process diagram of a method for manufacturing the superconducting thin film related to the embodiment of the invention.

Each of FIGS. 4(A), 4(B) and 4(C) is a process diagram continued from the process diagrams shown in FIGS. 3(A), 3(B) and 3(C).

BEST MODE FOR CARRYING OUT THE INVENTION

In the following, a superconducting thin film related to an embodiment of the invention and a method for manufacturing the superconducting thin film will be described in detail with reference to the attached drawings. In addition, in the drawings, the same reference numerals will be given to members (constituent elements) having the same or a corresponding function, and description thereof will be appropriately omitted. In addition, in the following description, terminologies such as "over" and "under" are used for convenience, and are not limited to a direction.

<Schematic Configuration of Superconducting Thin Film>

Figure 1:
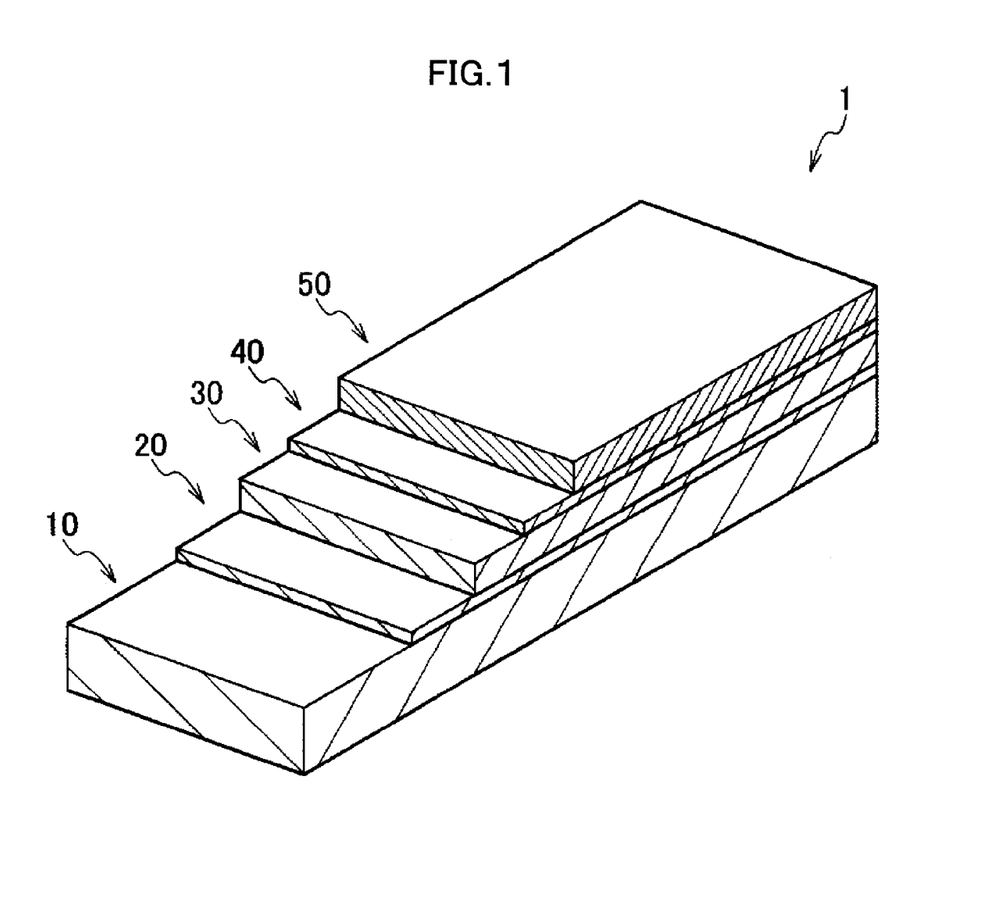
FIG. 1 is a diagram illustrating a laminated structure of a superconducting thin film related to an embodiment of the invention.

FIG. 1 shows a diagram illustrating a laminated structure of a superconducting thin film 1 related to an embodiment of the invention.

As shown in FIG. 1, the superconducting thin film 1 has a laminated structure in which a diffusion suppressing layer 20, an intermediate layer 30, a superconducting layer 40, and a protective layer 50 are sequentially formed on a metallic substrate 10.

The metallic substrate 10 is a substrate including metal elements that diffuse to the diffusion suppressing layer 20 side.

As a material of the metallic substrate 10, for example, metals such as Mo, Ta, Ag, Cu, Fe, Nb, Ni, W, and Mn that are excellent in strength and heat resistance, and alloys thereof may be used. Among these, it is preferable to use a metal such as Fe and Ni, or an alloy thereof from a viewpoint of corrosion resistance. In addition, examples of more preferable materials include stainless steel, Hastelloy (registered trademark), a Ni-based alloy, and an Fe-based alloy that are used as a low-magnetic and non-orientation metallic substrate and are excellent in corrosion resistance and heat resistance. However, Fe or Ni contained in the metallic substrate is a metal element having a tendency to diffuse to the diffusion suppressing layer 20 side.

A shape of the metallic substrate 10 is not particularly limited, and materials having various shapes such as a plate material, a wire material, and a stripe material may be used. For example, when a long metallic substrate is used, the superconducting thin film 1 may be applied as a superconducting wire. In addition, although not particularly limited, the thickness of the metallic substrate 10 is set to, for example, from 0.01 to 10 mm.

The diffusion suppressing layer 20 is a layer that suppresses diffusion of metal elements of the metal substrate 10 and a reaction of the metal elements, which leads to peeling-off, and adhesiveness with the metallic substrate 10 is higher compared to the related art. Details thereof will be described later.

The intermediate layer 30 is a layer that is formed on the metallic substrate 10 to realize high in-plane orientation in the superconducting layer 40. Physical characteristic values such as a coefficient of thermal expansion and a lattice constant show intermediate values between values of the metallic substrate 10 and values of the oxide superconductor making up the superconducting layer 40. Although not particularly limited, for example, the thickness of the intermediate layer 30 is set to from 1 nm to 100 nm. In addition, a specific layer configuration will be described later.

The superconducting layer 40 is formed on the intermediate layer 30 and is formed from an oxide superconductor, particularly, a copper oxide superconductor. As the copper oxide superconductor, a crystalline material, which is expressed by a compositional formula such as $REBa_2Cu_3O_{7-\delta}$ (referred to as RE-123), $Bi_2Sr_2CaCu_2O_{8+\delta}$ (also including a material in which a Bi site is doped with Pb), $Bi_2Sr_2Ca_2Cu_3O_{10+\delta}$ (also including a material in which a Bi site is doped with Pb), $(La, Ba)_2CuO_{4-\delta}$, $(Ca, Sr)CuO_{2-\delta}$ [Ca site may be Ba], $(Nd, Ce)_2CuO_{4-\delta}$, $(Cu, Mo)Sr_2(Ce,Y)_sCu_2O$ [referred to as (Cu, Mo)-12s2, and s=1, 2, 3, and 4], $Ba(Pb, Bi)O_3$, and $Tl_2Ba_2Ca_{n-1}Cu_nO_{2n+4}$ (n is an integer of two or more), may be used. In addition, the copper oxide superconductor may be configured with a combination of the crystalline materials.

Among the crystalline materials, due to a reason that superconducting characteristics are good and thus a crystalline structure is simple, it is preferable to use $REBa_2Cu_3O_{7-\delta}$. In addition, the crystalline material may be a polycrystalline material or a single crystalline material.

In $REBa_2Cu_3O_{7-\delta}$, RE is a single rare-earth element such as Y, Nd, Sm, Eu, Gd, Dy, Ho, Er, Tm, Yb, and Lu, or plural rare-earth elements, and among these, Y is preferable from a viewpoint that substitution with a Ba site is not likely to occur. In addition, $\delta$ represents a non-stoichiometric amount of oxygen, and for example, $\delta$ is from 0 to 1. It is preferable that $\delta$ be close to 0 from a viewpoint that a superconducting transition temperature is high. In addition, in regard to the non-stoichiometric amount of oxygen, when a high-pressure oxygen annealing or the like is performed by using a device such as an autoclave, $\delta$ may be less than 0, that is, a negative value.

In addition, $\delta$ of a crystalline material other than $REBa_2Cu_3O_{7-\delta}$ also represents a non-stoichiometric amount of oxygen, and for example, $\delta$ is from 0 to 1.

Although not particularly limited, for example, the film thickness of the superconducting layer 40 is from 500 to 3,000 nm.

Examples of a method for forming (film-forming) the superconducting layer 40 include a TFA-MOD (Metal Organic Deposition using TriFluoroAcetates) method, a PLD (Pulse Laser Deposition) method, a CVD (Chemical Vapor Deposition) method, an MOCVD (Metal Organic Chemical Vapor Deposition) method, a sputtering method, and the like. Among the film forming methods, it is preferable to use the MOCVD method due to a reason that a high vacuum is not necessary, a film may be formed on the metallic substrate 10 having a large area and a complicated shape, and mass productivity is excellent.

A protective layer 50 formed from silver is formed on an upper surface of the above-described superconducting layer 40, for example, by a sputtering method. In addition, after the superconducting thin film 1 is manufactured by forming the protective layer 50, a heat treatment may be performed with respect to the superconducting thin film 1.

<Detailed Configuration of Superconducting Thin Film>

Figure 2:
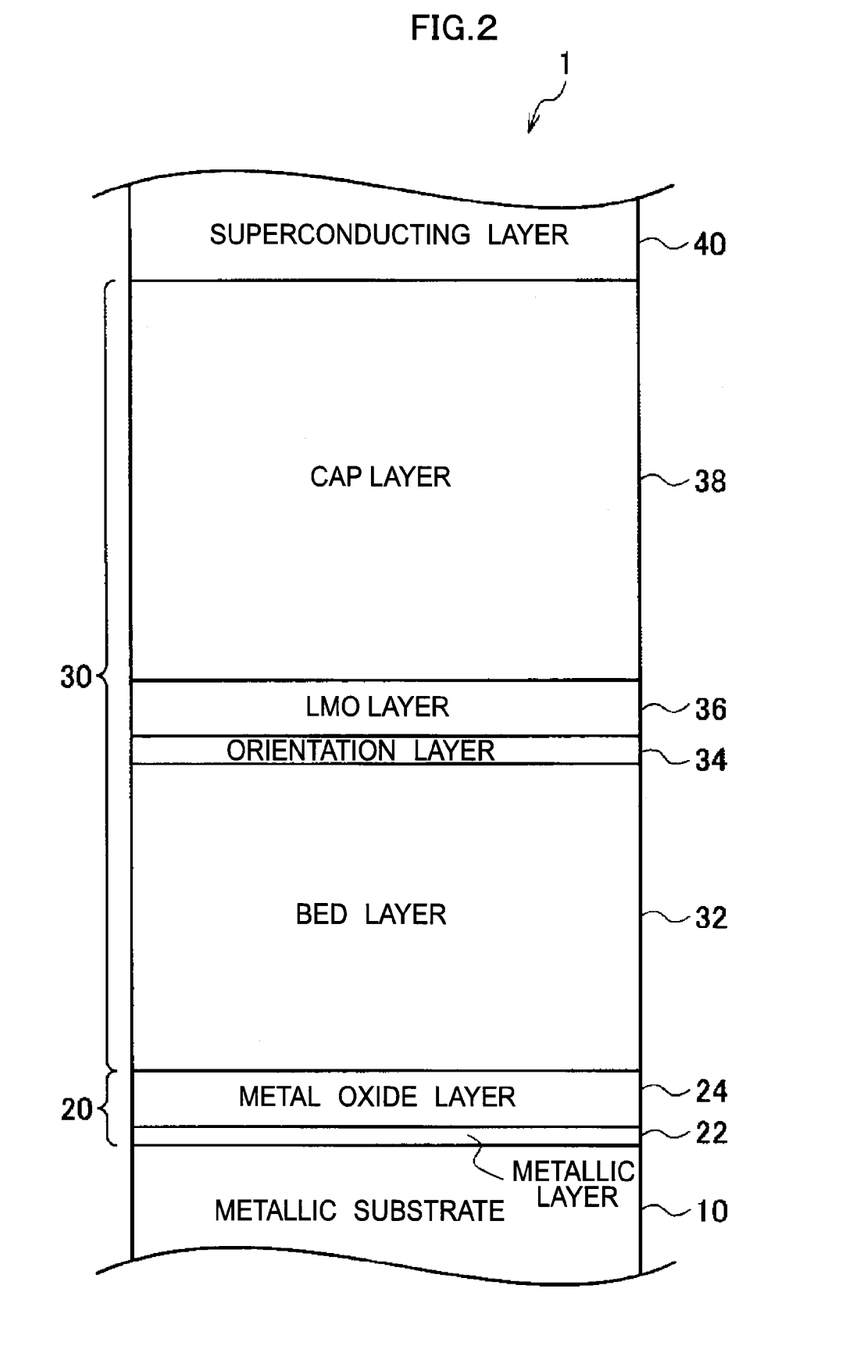
FIG. 2 is a cross-sectional diagram illustrating a detailed configuration of the superconducting thin film related to the embodiment of the invention.

FIG. 2 shows a cross-sectional diagram illustrating a detailed configuration of the superconducting thin film 1 related to the embodiment of the invention.

As shown in FIG. 2, the intermediate layer 30 of the superconducting thin film 1 has a configuration in which a bed layer 32, an orientation layer 34, an LMO layer 36, and a cap layer 38 are sequentially laminated. In the embodiment, the diffusion suppressing layer 20 is further provided between the intermediate layer 30 and the metallic substrate 10.

The bed layer 32 is a layer that is formed on the metallic substrate 10 and improves a biaxial orientation of the orientation layer 34. As a constituent material of the bed layer 32, $Gd_2Zr_2O_{7-\delta}$ ($-1<\delta<1$, hereinafter referred to as GZO), $YAlO_3$ (yttrium aluminate), YSZ (yttria stabilized zirconia), $Y_2O_3$, $Gd_2O_3$, $Al_2O_3$, $B_2O_3$, $Sc_2O_3$, $Cr_2O_3$, REZrO, $RE_2O_3$, or the like may be used. Here, RE represents a single rare-earth element or plural rare-earth elements. In addition, in addition to the function of improving the biaxial orientation of the orientation layer 34, the bed layer 32 may have other functions such as a function of suppressing diffusion of a metal element of the metallic substrate 10 similarly to the diffusion suppressing layer 20. In addition, it is preferable to use GZO as a constituent material of the bed layer 32 so as to have the function of improving the biaxial orientation.

Although not particularly limited, it is preferable that the thickness of the bed layer 32 be 10 nm or more from a viewpoint of suppressing a decrease in function of the bed layer 32, and it is preferable that the thickness be 500 nm or less from a viewpoint of suppressing warping of the metallic substrate 10.

Examples of a method for forming (film-forming) the bed layer 32 include a TFA-MOD method, a PLD method, a CVD method, an MOCVD method, a sputtering method, and the like. Among these, it is preferable to use the sputtering method from a viewpoint of easiness of manufacturing.

The orientation layer 34 is a layer that is formed on the bed layer 32 and causes a crystal of the superconducting layer 40 to orient in a constant direction. Examples of a constituent material of the orientation layer 34 include a polycrystalline material such as NbO and MgO. In addition, the same material as the bed layer 32, for example, GZO may be used.

Although not particularly limited, for example, the film thickness of the orientation layer 34 is from 1 to 20 nm.

Examples of a method for forming (film-forming) the orientation layer 34 include a method for forming a film using an IBAD (Ion Beam Assisted Deposition) method under an atmosphere of argon or oxygen, or a mixed gas atmosphere of argon and oxygen. In the IBAD method, while an assisted ion beam is emitted to a film formation surface from an inclination direction, a deposition particle ejected from a deposition source (MgO or the like) by RF sputtering (or ion beam sputtering) is deposited on the film formation surface to form a film.

In addition, when forming the orientation layer 34, reactive sputtering may be used. In reactive sputtering, a deposition source is set to, for example, Mg, sputtering is performed under a mixed gas atmosphere of argon and oxygen, and the ejected Mg and oxygen are caused to react with each other to form an MgO film. In addition, the orientation layer 34 may be a composite layer including a layer formed by an epitaxial method and a layer formed by an IBAD method.

The LMO layer 36 is disposed between the orientation layer 34 and the cap layer 38 and has a function of improving a lattice matching property of the cap layer 38. The LMO layer 36 is an oxide layer formed from a crystalline material having a compositional formula expressed by $LaMnO_{3+\delta}$ ($\delta$ is a non-stoichiometric amount of oxygen). In addition, although not particularly limited, for example, a value of $\delta$ is within a range of $-1<\delta<1$. In addition, it is preferable that the LMO layer 36 be an oxide layer formed form a crystalline material having a compositional formula expressed by $La_z(Mn_{1-x}M_x)_wO_{3+\delta}$ (M is at least one selected from Cr, Al, Co, and Ti, $\delta$ represents a non-stoichiometric amount of oxygen, $0<z/w<2$, and $0<x\leq1$) from a viewpoint of lowering a phase transition temperature at which a crystalline lattice of LMO becomes cubic.

Although not particularly limited, it is preferable that the thickness of the LMO layer 36 be 100 nm or less from a viewpoint of suppressing surface defects of the LMO layer 36, and more preferably 4 nm or more from a manufacturing viewpoint.

Examples of a method for forming (film-forming) the LMO layer 36 include a film formation in accordance with an RF sputtering method and a PLD method in which formation of film is carried out while heating the metallic substrate 10.

The cap layer 38 is a layer that is formed on the LMO layer 36 to protect the LMO layer 36, and further increases a lattice matching property with the superconducting layer 40. Specifically, the cap layer 38 is configured by a fluorite-type crystalline structure that contains a rare-earth element and has self-orientation. For example, the fluorite-type crystalline structure is at least one selected from $CeO_2$ and $PrO_2$. In addition, the cap layer 38 may mainly contain the fluorite-type crystalline structure, and may further contain impurities.

Although not particularly limited, it is preferable that the film thickness of the cap layer 38 be 50 nm or more to obtain sufficient orientation, and more preferably 300 nm or more. However, when exceeding 600 nm, a film formation time increases, and thus it is preferable that the thickness be set to 600 nm or less.

Examples of a method for forming (film-forming) the cap layer 38 include a film formation in accordance with a PLD method and an RF (radio frequency) sputtering method.

In addition, in the embodiment, the diffusion suppressing layer 20, which is provided between the intermediate layer 30 including the respective layers 32 to 38 and the metallic substrate 10, includes a metallic layer 22 and a metal oxide layer 24.

The metallic layer 22 is formed on the main surface of the metallic substrate 10 and includes a metal element capable of being passivated as a main component. In this manner, when the metallic layer 22 is formed on the main surface of the metallic substrate 10, since an interface thereof is formed from metals, affinity between the metallic substrate 10 and the metallic layer 22 may increase and thus adhesiveness between the metallic substrate 10 and the metallic layer 22 may increase. In addition, the "main component" represents a component of which content is the largest among constituent components contained in the metallic layer 22.

Although a kind of metal element of the metallic layer 22 is not particularly limited, specifically, it is preferable that the metal element be at least one selected from Al, Cr, and a rare-earth element. In regard to a distance, as the metallic layer 22 is closer to the intermediate layer 30 or the superconducting layer 40 than the metallic substrate 10, it is preferable that diffusion rate to the intermediate layer 30 be slower than that to the metal element making up the metallic substrate 10. Specifically, it is preferable that the metal element of the metallic layer 22 be at least one selected from Cr and a rare-earth element. On the other hand, it is preferable that the metal element be at least one selected from Al and Cr from a viewpoint that it is easy for the metal element to be passivated when being oxidized.

Although not particularly limited, it is preferable that the thickness of the metallic layer 22 be 1 nm or more because when the thickness is smaller than 1 nm, film uniformity decreases and thus adhesiveness may not be raised. In addition, the thickness is preferably 5 nm or more from a viewpoint of securing relatively stable adhesiveness. However, when the thickness is too large, high cost or warping is caused, and thus for example, the thickness is preferably 100 nm or less.

Next, the metal oxide layer 24 is a layer that suppresses diffusion of the metal element between the metallic substrate 10 and the metallic layer 22. The metal oxide layer 24 is formed on a surface of the metallic layer 22 and is passivated by oxidation of the same metal element as that contained in the metallic layer 22. In addition, it is possible to confirm whether or not the passivation occurs by confirming constituent materials of the metal oxide layer 24 by X-ray diffraction measurement or the like.

In addition, when the metal element of the metallic layer 22 and the metal element of the metal oxide layer 24 are made to be the same as each other, affinity between the metallic layer 22 and the metal oxide layer 24 may increase, and thus adhesiveness between the metallic layer 22 and the metal oxide layer 24 may increase. Accordingly, as described above, when considering an increase in adhesiveness also between the metallic substrate 10 and the metallic layer 22, adhesiveness between the metallic substrate 10 and the metal oxide layer 24 increases through a medium such as the metallic layer 22. In addition, the "main component" represents a component of which content is the largest among constituent components contained in the metal oxide layer 24.

It is preferable that a constituent material of the metal oxide layer 24 have a compositional formula expressed by $A_iO_j$ ($1<(j/i)\leq 3$), and A being the metal element contained in the metallic layer 22 be at least one selected from Al, Cr, and a rare-earth element. Among these, it is preferable that A being the metal element be at least one selected from Al and Cr from a viewpoint that it is easy for the metal element to be passivated as described above. In addition, the constituent material of the metal oxide layer 24 is generally expressed by $A_2O_3$, but since there is variation in an oxygenated state, an actual compositional formula becomes $A_iO_j$ ($1<(j/i)\leq 3$). In addition, hereinafter, a compositional formula $Cr_iO_j$ ($1<(j/i)\leq 3$) and a compositional formula $Al_iO_j$ ($1<(j/i)\leq 3$) are also expressed by $Cr_2O_3$ and $Al_2O_3$, respectively.

Although not particularly limited, it is preferable that the thickness of the metal oxide layer 24 be larger than that of the metallic layer 22 from a viewpoint of increasing adhesiveness between the metallic substrate 10 and the metal oxide layer 24 through the metallic layer 22 as a medium, and a viewpoint of suppressing diffusion of metal elements contained in the metallic substrate 10 and the metallic layer 22. Specifically, it is preferable that the thickness of the metal oxide layer 24 be 10 nm or more from a viewpoint of exhibiting a function of suppressing diffusion of the metal elements contained in the metallic substrate 10 and the metallic layer 22 and of preventing interlayer peeling-off and generation of air bubbles. In addition, it is preferable that the thickness be 30 nm or more from a viewpoint of substantially making the diffusion of the metal elements, which are contained in the metallic substrate 10 and the metallic layer 22, be zero. However, when the thickness is too large, there is a concern that cracking or peeling-off may occur in the metal oxide layer 24 itself. Accordingly, it is preferable that the thickness be, for example, 300 nm or less.

Furthermore, from a viewpoint of relatively increasing adhesiveness between the metallic substrate 10 and the metal oxide layer 24, it is preferable to provide a composition gradient layer (not shown) between the metallic layer 22 and the metal oxide layer 24. In the composition gradient layer, the metal element contained in the metallic layer 22 and the metal oxide contained in the metal oxide layer 24 co-exist, and a ratio of the metal oxide with respect to the metal element is set to continuously increase in a lamination direction from the metallic layer 22 to the metal oxide layer 24 (in a direction from the metallic substrate 10 to the superconducting layer 40).

<Method for Manufacturing Superconducting Thin Film>

Next, a method for manufacturing the superconducting thin film 1 as described above will be described in detail.

Figure 3A:
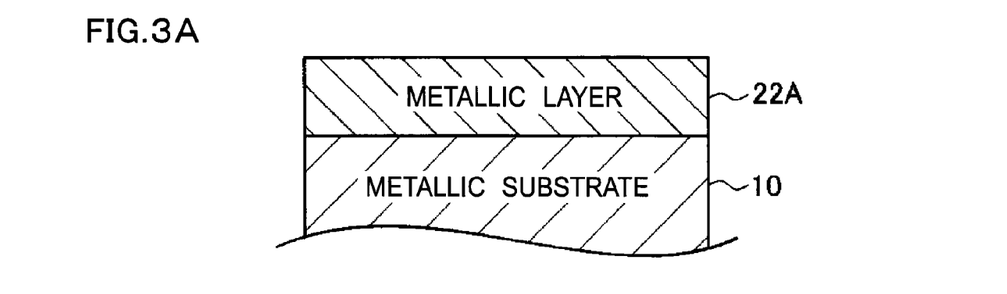
Figure 3B:
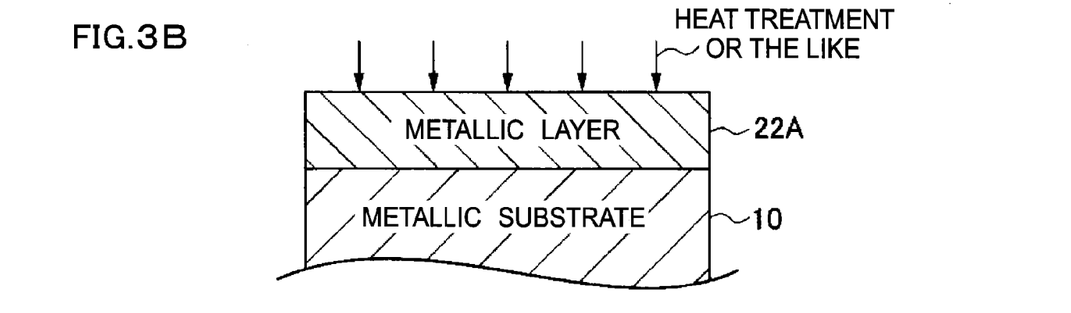
Figure 3C:
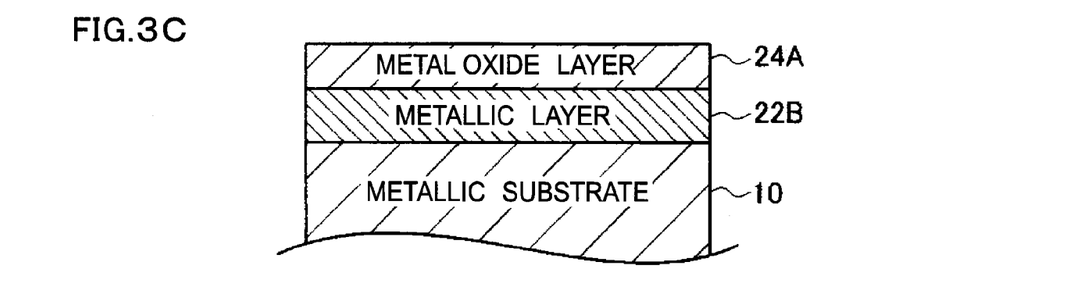
Figure 4A:
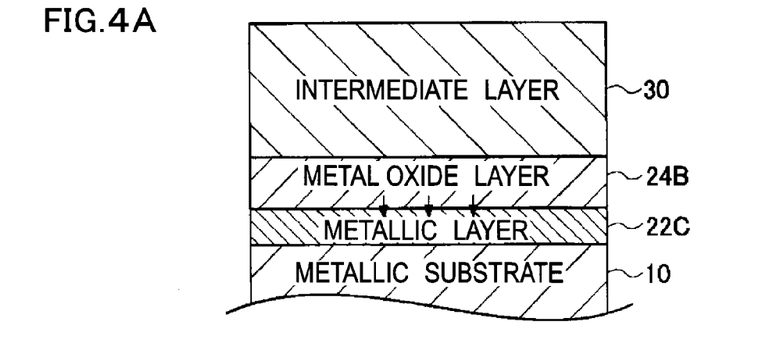
Figure 4B:
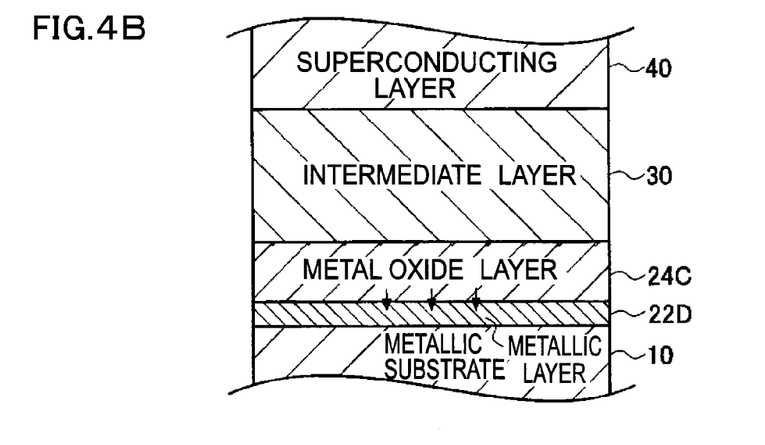
Figure 4C:
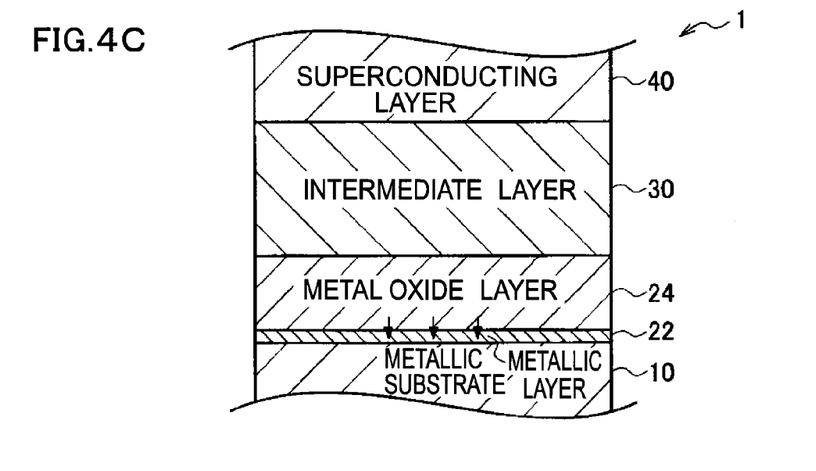

Each of FIGS. 3(A), 3(B) and 3(C) shows a process diagram of a method for manufacturing the superconducting thin film 1 related to the embodiment of the invention. Each of FIGS. 4(A), 4(B) and 4(C) shows a process diagram continued from the process diagram shown in FIGS. 3(A), 3(B) and 3(C).

—Metallic Layer Forming Process—

In the method for manufacturing the superconducting thin film 1 related to the embodiment of the invention, first, as shown in FIG. 3(A), a metallic layer forming process, which forms a metallic layer 22A including a metal element capable of being passivated as a main component on a main surface of the metallic substrate 10, is performed. Here, the metallic layer 22A is formed in a thickness with which a part of the metallic layer 22A remains after subsequent entire processes are performed, that is, after completion of the superconducting thin film 1. Although not particularly limited, for example, a specific thickness is from 10 to 500 nm.

Examples of forming the metallic layer 22A include a TFA-MOD method, a PLD method, a CVD method, an MOCVD method, a sputtering method, and the like.

—Metal Oxide Layer Forming Process—

Next, as shown in FIGS. 3(B) and 3(C), a metal oxide layer forming process, which forms a passivated metal oxide layer 24A on a surface of the metallic layer 22A by causing the metal element making up the metallic layer 22A to be oxidized in such a manner that a part of the metallic layer 22A remains, is performed. Here, examples of formation of the metal oxide layer 24A include formation in accordance with a heat treatment method, a plating method, or an anodic oxidation method with respect to the metallic layer 22A, or formation on the metallic layer 22A in accordance with various film forming methods such as a TFA-MOD method, a PLD method, a CVD method, an MOCVD method, and a sputtering method.

Among these, the heat treatment method is preferable because it is easy to form a composition gradient layer, in which a ratio of the metal oxide with respect to the metal element is set to continuously increase in a lamination direction (in a direction from the metallic substrate 10 to the superconducting layer 40), between a metallic layer 22B and a metal oxide layer 24A, and adhesiveness may increase. In the heat treatment method, specifically, oxidation of the metal element of the metallic layer 22 is performed under an oxygen-containing atmosphere. A heat treatment temperature is not particularly limited, but the oxidation is performed, for example, at a temperature from 200 to 900° C.

Similarly, from a viewpoint that it is easy to form the composition gradient layer, it is also preferable to use a so-called inclination film forming method in the sputtering method (in this case, the metallic layer forming process is performed by the inclination film forming method). In regard to the inclination film forming method, for example, in a case of manufacturing a wire material as the superconducting thin film 1, when oxygen is supplied to only one side (film formation outlet side) of a metal element target, a film of a metal element is continuously formed on the other side (film formation inlet side), and a film of a metal oxide is continuously formed on the one side. In addition, at this time, it is preferable to provide a shielding plate or the like between the one side and the other side. In addition, conditions of a film formation atmosphere are not particularly limited, but for example, a total pressure may be set to 4 mTorr, and an oxygen supply amount may be set to 3 to 5% of the total pressure.

In addition, in a case of using aluminum as the metal element, since it is difficult to perform the oxidation treatment by the above-described heat treatment, it is preferable to use an anodic oxidation method.

—Intermediate Layer Forming Process—

Next, as shown in FIG. 4(A), an intermediate layer forming process, which forms the intermediate layer 30 on a metal oxide layer 24B in such a manner that a part 22C of the metallic layer 22B remains, is performed. As a method for forming the intermediate layer 30, for example, a PLD method, a CVD method, an MOCVD method, an IBAD method, a TFA-MOD method, a sputtering method, an electron beam deposition method, or the like may be used. In addition, it is preferable to use the electron beam deposition method from a viewpoint of realizing highly efficient film formation. In addition, in the intermediate layer forming process, a post annealing process is appropriately performed. In the post annealing process, the metallic substrate 10 is heated at any temperature within a temperature range from 700 to 950° C., and preferably within a temperature range from 800 to 900° C. to perform a treatment (planarization and valence control) with respect to a surface of the intermediate layer 30.

Here, in the metal oxide layer forming process, since the metal oxide layer 24A is formed in such a manner that a part 22B of the metallic layer 22A remains, even when in the intermediate layer forming process, an environment is reached (a high-temperature oxygen atmosphere or the like) in which a metal element of the metallic substrate 10 diffuses and thus an oxide or the like is generated at an interface, the metallic layer 22B that is closer to the intermediate layer 30 is oxidized first. Accordingly, oxidation of the metal element contained in the metallic substrate 10 is suppressed. In addition, since the intermediate layer forming process is also performed in such a manner that the part 22C of the metallic layer 22B remains, the metallic layer 22B becomes the metallic layer 22C having a relatively small thickness, and the metal oxide layer 24A becomes the metal oxide layer 24B having a relatively large thickness.

—Superconducting Layer Forming Process—

Next, as shown in FIG. 4(B), a superconducting layer forming process, which forms the superconducting layer 40 on the intermediate layer 30 in such a manner that a part 22D of the metallic layer 22C remains, is performed. Examples of a method for forming (film-forming) the superconducting layer 40 include a PLD method, a CVD method, an MOCVD method, an MOD method, a sputtering method, and the like. In addition, it is preferable to use the MOCVD method from a viewpoint that highly efficient film formation without using a high vacuum may be realized.

In the superconducting layer forming process, for example, in a case of forming the superconducting layer 40 including YBCO as a main component by using the MOCVD method, film formation conditions are appropriately set in accordance with a constituent material, a film thickness, or the like of the superconducting layer 40. For example, preferable conditions are as follows:

Substrate Conveyance Speed: from 80 to 500 m/h

Film Formation Temperature: 800 to 900° C.

In addition, it is preferable to perform the superconducting layer forming process under an oxygen gas atmosphere from a viewpoint that a non-stoichiometric amount $\delta$ of oxygen is made to be small to increase a superconducting characteristic.

Here, in the intermediate layer forming process, since the intermediate layer 30 is formed in such a manner that the part 22C of the metallic layer 22B remains, even when in the superconducting layer forming process, an environment is reached (a high-temperature oxygen atmosphere or the like) in which a metal element of the metallic substrate 10 diffuses and thus an oxide or the like is generated at an interface, the metallic layer 22C that is closer to the superconducting layer 40 is oxidized first. Accordingly, oxidation of the metal element of the metallic substrate 10 is suppressed.

In addition, in the superconducting layer forming process, the metallic layer 22C also becomes the metallic layer 22D having a relatively small thickness, and the metal oxide layer 24B becomes the metal oxide layer 24C having a relatively large thickness.

—Other Processes—

Next, the superconducting thin film 1 as shown in FIG. 4(C) is manufactured through other processes such as a protective layer 50 forming process and an annealing process.

Here, in the superconducting layer forming process, since the superconducting layer 40 is formed in such a manner that the metallic layer 22D that is a part of the metallic layer 22C remains, even when in the other processes, an environment is reached (a high-temperature oxygen atmosphere or the like) in which a metal element of the metallic substrate 10 diffuses and thus an oxide or the like is generated at an interface, the metallic layer 22D that is closer to the protective layer 50 is oxidized first. Accordingly, oxidation of the metal element of the metallic substrate 10 is suppressed.

In addition, even in other processes, the metallic layer 22D becomes the metallic layer 22 having a relatively small thickness, and the metal oxide layer 24C becomes the metal oxide layer 24 having a relatively large thickness, and thus the metallic layer 22 and the metal oxide layer 24 are maintained even after completion of the superconducting thin film 1. Accordingly, even after the superconducting thin film 1 is manufactured, as described above, adhesiveness between the metallic substrate 10 and the metal oxide layer 24 increases through a medium such as the metallic layer 22.

Modification Example

In addition, the specific embodiment of the invention has been described in detail, but the invention is not limited to the embodiment, and it will be apparent to a person having ordinary skill in the art that various embodiments are possible within a scope of the invention. For example, the above-described plural embodiments may be appropriately carried out in combination. In addition, the following modification example may be appropriately combined.

For example, the entirety or a part (the LMO layer 36 or the like) of the intermediate layer 30 may be omitted. In addition, the protective layer 50 may be also omitted. In addition, a sequence of the respective layers of the intermediate layer 30 may be appropriately changed.

In addition, the entirety of the disclosure of Japanese Patent Application No. 2011-152866 is incorporated by reference in this specification.

All of the documents, patent applications, and technical standards are incorporated by reference in this specification to the same degree as a case in which incorporation by reference of the documents, the patent applications, and the technical standards are specifically and individually described.

EXAMPLES

In the following, the superconducting thin film related to the invention and the method for manufacturing the superconducting thin film will be described with reference to examples, but the invention is not limited to the examples.

Examples 1 to 8

In each of Examples 1 to 8, first, surface polishing was performed with respect to one surface of a tape-shaped metallic substrate formed from Hastelloy C-276 by abrasive grain polishing. Next, a Cr film having a thickness of 10 to 250 nm was formed using a plating method to form a plated layer (metallic layer). The plating method that was used at this time was electrolytic plating, and 250 g/L of chromic acid anhydride, 2.5 g/L of sulfuric acid, and a Sargent bath in which a bath temperature was 50 to 55° C., and current density was 15 to 60 A/dm$^2$ were used. In addition, a conveyance speed of the metallic substrate was set to 60 m/h to provide surface flatness of the plated layer.

Then, an oxidation treatment was performed while a part of the metallic layer was left as is, and thus Cr of the metallic layer was passivated, whereby a metal oxide layer that was formed from $Cr_2O_3$ and had a thickness of 5 to 300 nm was formed. At this time, each surface roughness Ra of the metal oxide layer was 10 nm or less. Next, a bed layer that was formed from $Gd_2Zr_2O_7$ and had a thickness of 100 nm was formed using a sputtering device. In addition, 10 nm of an orientation layer (IBAD-MgO layer) formed from MgO was formed on the bed layer by an IBAD method at a normal temperature. 200 nm of a cap layer formed from $CeO_2$ was formed on the orientation layer by a sputtering method at 650° C. A superconducting layer formed from YBCO was formed on the cap layer by an MOCVD method at 845° C. in a thickness of 1 μm.

According to the above-described manufacturing method, superconducting wires were obtained as a superconducting thin film related to Examples 1 to 8.

Examples 9 to 16

In each of Examples 9 to 16, first, surface polishing was performed with respect to one surface of the tape-shaped metallic substrate formed from Hastelloy C-276 by abrasive grain polishing. Next, a metallic layer, which was formed from Al and had a thickness of 10 to 250 nm, was formed using a sputtering device at a normal temperature.

Next, Al of the metallic layer was passivated while a part of the metallic layer was left as is by an anodic oxidation treatment method, whereby a metal oxide layer formed from $Al_2O_3$ was formed to have a thickness of 5 to 300 nm when being a superconducting wire. In the anodic oxidation treatment method that was used at this time, a temperature of a treatment bath was set to 60° C., and a mixed aqueous solution of boric acid and sodium borate of pH 5 to 7 was used. Each metal oxide layer was formed by changing an application voltage.

Then, an intermediate layer such as a bed layer and a superconducting layer were sequentially formed by the same method as Examples 1 to 8, whereby a superconducting wire was obtained as a superconducting thin film related to Examples 9 to 16.

Comparative Example 1

In Comparative Example 1, a metallic layer formed from Cr was formed by the same method as Example 1, and then an intermediate layer such as a bed layer and a superconducting layer were sequentially formed without performing an oxidation treatment, whereby a superconducting wire was obtained as a superconducting thin film related to Comparative Example 1.

Comparative Example 2

In Comparative Example 2, a metallic layer formed from Cr was formed by the same method as Example 9, and then an intermediate layer such as a bed layer and a superconducting layer were sequentially formed without performing an oxidation treatment, whereby a superconducting wire was obtained as a superconducting thin film related to Comparative Example 2.

Comparative Example 3

In Comparative Example 3, an intermediate layer such as a bed layer and a superconducting layer were sequentially formed by the same method as Example 1 without forming the metallic layer and the metal oxide layer, whereby a superconducting wire was obtained as a superconducting thin film related to Comparative Example 3.

<Characteristic Evaluation Test>

Confirmation of interlayer peeling-off of the superconducting wire related to each of the examples and the comparative examples was performed by observing a surface of the superconducting wire that was obtained using Auger electron spectroscopy. In addition, observation of a surface of the superconducting wire that was obtained was performed in a state in which bending strain was not applied to the superconducting wire that was obtained, and in a state in which the superconducting wire was wound into a coil and bending strain was applied thereto.

The Auger electron spectroscopy was performed by a PHI-660 type scanning Auger electron spectroscopy device manufactured by PHYSICAL ELECTRONICS Inc. Measurement was performed under conditions in which an acceleration voltage of an electron gun was set to 10 kV, and a sample current was set to 500 nA.

Measurements at this time are collectively shown in Table 1, and in Table 1, a state in which peeling-off and air bubbles were not present at all is indicated by A, a state in which the peeling-off was not present, but air bubbles were present is indicated by B, and a state in which the peeling-off occurred is indicated by C.

TABLE 1

| | Before Oxidation Treatment | After Formation of Superconducting Wire Material | | | Evaluation Results | |
|---|---|---|---|---|---|---|
| | Formed Metallic Layer | Metallic Layer Thickness (mm) | Metallic Layer Thickness (mm) | Formed Metal Oxide Layer | Metal Oxide Layer Thickness (mm) | Evaluation of Interlayer Peeling-off (Normal State) | Evaluation of Interlayer Peeling-off (With Bending Strain) |
| Example 1 | Cr | 10 | 5 | $Cr_2O_3$ | 7 | B | B |
| Example 2 | Cr | 15 | 5 | $Cr_2O_3$ | 13 | A | A |
| Example 3 | Cr | 50 | 20 | $Cr_2O_3$ | 30 | A | A |
| Example 4 | Cr | 100 | 20 | $Cr_2O_3$ | 100 | A | A |
| Example 5 | Cr | 100 | 70 | $Cr_2O_3$ | 50 | A | A |
| Example 6 | Cr | 100 | 115 | $Cr_2O_3$ | 5 | B | B |
| Example 7 | Cr | 200 | 100 | $Cr_2O_3$ | 140 | A | A |
| Example 8 | Cr | 250 | 100 | $Cr_2O_3$ | 300 | A | B |
| Example 9 | Al | 10 | 5 | $Al_2O_3$ | 7 | B | B |
| Example 10 | Al | 15 | 5 | $Al_2O_3$ | 13 | A | A |
| Example 11 | Al | 50 | 20 | $Al_2O_3$ | 30 | A | A |
| Example 12 | Al | 100 | 20 | $Al_2O_3$ | 100 | A | A |
| Example 13 | Al | 100 | 70 | $Al_2O_3$ | 50 | A | A |
| Example 14 | Al | 100 | 115 | $Al_2O_3$ | 5 | B | B |
| Example 15 | Al | 200 | 100 | $Al_2O_3$ | 140 | A | A |
| Example 16 | Al | 250 | 100 | $Al_2O_3$ | 300 | A | B |
| Comparative Example 1 | Cr | 10 | none | $Cr_2O_3$ | 12 | B | C |
| Comparative Example 2 | Al | 10 | none | $Al_2O_3$ | 12 | B | C |
| Comparative Example 3 | none | none | none | none | none | C | C |

From the above-described results, it can be seen that in Comparative Examples 1 and 2, the result of the interlayer peeling-off evaluation was further improved compared to Comparative Example 3. However, it entered a state in which the peeling-off was not present, but the air bubbles were present. In addition, in a state in which bending strain was applied, the peeling-off occurred similarly to Comparative Example 3.

However, when being compared to Comparative Examples 1 to 3, in Examples 1 to 16, it can be seen that even in a state in which the bending strain was applied, the peeling-off did not occur.

In addition, when being compared to other examples and comparative examples in which the thickness of the metal oxide layer was less than 10 nm, in the superconducting wires of Examples 2 to 5, 7, 8, 10 to 13, 15 and 16 in which the thickness of the metal oxide layer was 10 nm or more, it can be seen that the peeling-off and the air bubble were not present at all.

Reference numeral 1 represents a superconducting thin film.
Reference numeral 10 represents a metallic substrate.
Reference numeral 22 represents a metallic layer.
Reference numeral 24 represents a metal oxide layer.
Reference numeral 30 represents an intermediate layer.
Reference numeral 40 represents a superconducting layer.

What is claimed is:

1. A superconducting thin film comprising:
   a metallic substrate,
   a metallic layer formed on a main surface of the metallic substrate, wherein the metallic layer comprises a metal element,
   a metal oxide layer formed on the metallic layer, wherein the metal oxide layer comprises the metal element in passivated form, and
   a superconducting layer formed on the metal oxide layer directly or through an intermediate layer, wherein the superconducting layer comprises an oxide superconductor.

2. The superconducting thin film according to claim 1, wherein the metal oxide layer has a formula of $A_iO_j$ ($1<(j/i) \leq 3$), wherein A is at least one selected from the group consisting of Al, Cr, and a rare-earth element.

3. The superconducting thin film according to claim 2, further comprising:
   a composition gradient layer between the metallic layer and the metal oxide layer,
   wherein
   an oxide of the metal element and the metal element co-exist in the composition gradient layer, and
   a ratio of the oxide of the metal element with respect to the metal element in the composition gradient layer continuously increases in a lamination direction from the metallic layer to the metal oxide layer.

4. The superconducting thin film according to claim 3, wherein at least the main surface of the metallic substrate comprises a Ni-based alloy or an Fe-based alloy.

5. The superconducting thin film according to claim 4, wherein a thickness of the metal oxide layer is 10 nm to 300 nm.

6. The superconducting thin film according to claim 4, wherein A comprises Al.

7. The superconducting thin film according to claim 4, wherein A comprises Cr.

8. The superconducting thin film according to claim 3, wherein at least the main surface of the metallic substrate comprises a Ni-based alloy.

9. The superconducting thin film according to claim 3, wherein at least the main surface of the metallic substrate comprises an Fe-based alloy.

10. The superconducting thin film according to claim 1, further comprising:
   a composition gradient layer between the metallic layer and the metal oxide layer, wherein
   an oxide of the metal element and the metal element co-exist in the composition gradient layer, and
   a ratio of the oxide of the metal element with respect to the metal element in the composition gradient layer continuously increases in a lamination direction from the metallic layer to the metal oxide layer.

11. The superconducting thin film according to claim 1, wherein a thickness of the metal oxide layer is 10 nm or more.

12. The superconducting thin film according to claim 1, wherein a thickness of the metal oxide layer is 300 nm or less.

13. The superconducting thin film according to claim 1, wherein at least the main surface of the metallic substrate comprises a Ni-based alloy or an Fe-based alloy.

14. The superconducting thin film according to claim 1, wherein a thickness of the metal oxide layer is 10 nm to 300 nm.

15. The superconducting thin film according to claim 1, wherein at least the main surface of the metallic substrate comprises a Ni-based alloy.

16. The superconducting thin film according to claim 1, wherein at least the main surface of the metallic substrate comprises an Fe-based alloy.

* * * * *